(12) United States Patent
Candela

(10) Patent No.: US 11,506,716 B2
(45) Date of Patent: Nov. 22, 2022

(54) ELECTRICAL INSTALLATION MEASURING SYSTEM

(71) Applicant: Prysmian S.p.A., Milan (IT)

(72) Inventor: Roberto Candela, Milan (IT)

(73) Assignee: Prysmian S.p.A., Milan (IT)

( * ) Notice: Subject to any disclaimer, the term of this patent is extended or adjusted under 35 U.S.C. 154(b) by 207 days.

(21) Appl. No.: 17/100,214

(22) Filed: Nov. 20, 2020

(65) Prior Publication Data

US 2021/0156920 A1 May 27, 2021

(30) Foreign Application Priority Data

Nov. 26, 2019 (IT) .................. 102019000022140

(51) Int. Cl.
*G01R 31/327* (2006.01)
*G01R 31/58* (2020.01)
*G01R 19/145* (2006.01)

(52) U.S. Cl.
CPC ......... *G01R 31/327* (2013.01); *G01R 19/145* (2013.01); *G01R 31/58* (2020.01)

(58) Field of Classification Search
CPC ...... G01R 31/00; G01R 31/08; G01R 31/081; G01R 31/086; G01R 31/327; G01R 31/3277; G01R 31/50; G01R 31/52; G01R 31/56; G01R 31/58; G01R 1/00; G01R 1/36; G01R 19/00; G01R 19/145; G01R 21/00; G01R 21/006; G01R 27/00; G01R 27/02; G01R 27/025; G01R 27/16; G01R 27/18; G08C 17/00; G08C 17/02
USPC ............................................. 324/140 R, 142
See application file for complete search history.

(56) References Cited

U.S. PATENT DOCUMENTS

| | | | | |
|---|---|---|---|---|
| 5,744,978 A | * | 4/1998 | Gilliam ............... | G11C 11/4091 326/49 |
| 6,946,847 B2 | * | 9/2005 | Nishimori ............. | H03H 11/30 333/17.3 |
| 7,098,646 B2 | * | 8/2006 | Rose .................. | G01R 31/2822 324/95 |
| 7,554,320 B2 | * | 6/2009 | Kagan ................ | H04L 12/2898 702/62 |
| 7,969,155 B2 | * | 6/2011 | Varghai ................ | H02H 3/081 324/521 |
| 8,493,060 B1 | | 7/2013 | Mahoney | |
| 9,568,522 B2 | * | 2/2017 | Aiello ............... | H02J 13/00002 |
| 10,132,846 B2 | * | 11/2018 | Hurwitz ............... | G01R 25/005 |
| 2005/0212526 A1 | | 9/2005 | Blades | |

(Continued)

FOREIGN PATENT DOCUMENTS

| | | |
|---|---|---|
| EP | 2889630 A1 | 7/2015 |
| WO | 2018009932 A1 | 1/2018 |

*Primary Examiner* — Hoai-An D. Nguyen
(74) *Attorney, Agent, or Firm* — Slater Matsil, LLP

(57) ABSTRACT

It is described an electrical installation measuring system comprising a control and measuring device configured to be installed on an electrical panel of an electrical installation and perform at least one measure of an electrical parameter of the electrical installation depending on an electrical load connected to the electrical installation and transmit command signals along a telecommunication link. The system further comprises a variable load device connectable to the electrical installation and configured to: receive the command signals from the telecommunication link; and assume a plurality of load configurations according to the command signals.

20 Claims, 5 Drawing Sheets

(56) References Cited

U.S. PATENT DOCUMENTS

2009/0248329 A1    10/2009   Restrepo
2011/0208468 A1    8/2011   Yamamoto et al.
2017/0248638 A1    8/2017   Mitolo et al.
2019/0261067 A1    8/2019   Norwood et al.

* cited by examiner

ELECTRICAL INSTALLATION MEASURING SYSTEM

CROSS-REFERENCE TO RELATED APPLICATIONS

This application claims the benefit of Italian Patent Application No. 102019000022140 filed on Nov. 26, 2019, which application is hereby incorporated herein by reference.

TECHNICAL FIELD

The present disclosure relates to apparatuses for measuring electrical parameters of electrical installations.

BACKGROUND

In Low Voltage electrical installations, electricians measure electrical parameters by employing metering devices (e.g. network analyzers) that can be alternatively connected to different points of the electrical installation. The performed measures can have the aim of testing an electrical installation to verify its compliance with specific regulations.

Document WO2018/009932 discloses an electrical network that includes a monitoring device, one or more electrical devices, a network manager, and a diagnostic device. The diagnostic device can receive power for performing testing operations via a power source. The diagnostic device can create (using, for example, transformers, inverters, converters, diode bridges) a level and type of power (referred to herein as test signals) that is used for testing one or more electrical devices using the monitoring device.

Document US2019/0261067 describes a system for providing information about electrical devices in a residence, which includes a power measurement device, an electrical device identification component and a notification component. The power measurement device measures characteristics of electrical power in one or more electrical power lines in the residence. Based on power consumption by the specific electrical devices, the notification component determines events or conditions associated with specific electrical devices (for example abnormal usage, device failure, excess power consumption). Notifications relating to at least one of the events or conditions associated with the specific electrical devices are provided to a person associated with the residence (for example, homeowner or other resident).

SUMMARY

In one embodiment, an electrical installation measuring system includes a control and measuring device configured to be installed on and electrically connected to an electrical panel of an electrical installation and a variable load device connectable to the electrical installation. The control and measuring device is configured to perform at least one measure of an electrical parameter of the electrical installation depending on an electrical load connected to the electrical installation, and transmit command signals along a telecommunication link. The variable load device is connectable to the electrical installation and configured to receive said command signals from the telecommunication link, and assume a plurality of load configurations according to said command signals.

In one embodiment, an electrical installation measuring system includes a control and measuring device and a variable load device. The control and measuring device is configured to be installed on and electrically connected to an electrical panel of an electrical installation, and comprises a measuring circuit configured to perform a measurement of an electrical parameter of the electrical installation depending on an electrical load connected to the electrical installation, a first wireless communication circuit configured to transmit command signals along a telecommunication link, and a control and processing device configured to manage the operation of the measuring circuit and the first wireless communication circuit. The variable load device is connectable to the electrical installation and configured to receive said command signals from the telecommunication link, and assume a plurality of load configurations according to said command signals.

In one embodiment, an electrical installation measuring system comprises a control and measuring device configured to be installed on and electrically connected to an electrical panel of an electrical installation. The control and measuring device is configured to perform at least one measure of an electrical parameter of the electrical installation depending on an electrical load connected to the electrical installation, and transmit command signals along a telecommunication link. The system further includes a variable load device connectable to the electrical installation and configured to receive said command signals from the telecommunication link, and assume a plurality of load configurations according to said command signals. The system further includes a computer device external to the control and measuring device and configured to exchange data with the control and measuring device and store values of electrical parameters; and a client device configured to exchange data/information with the control and measuring device and to access to the stored values by a user of the at least a client device.

BRIEF DESCRIPTION OF THE DRAWINGS

Further characteristics and advantages will be more apparent from the following description of the various embodiments given as a way of an example with reference to the enclosed drawings in which.

DETAILED DESCRIPTION OF ILLUSTRATIVE EMBODIMENTS

Figure 1:
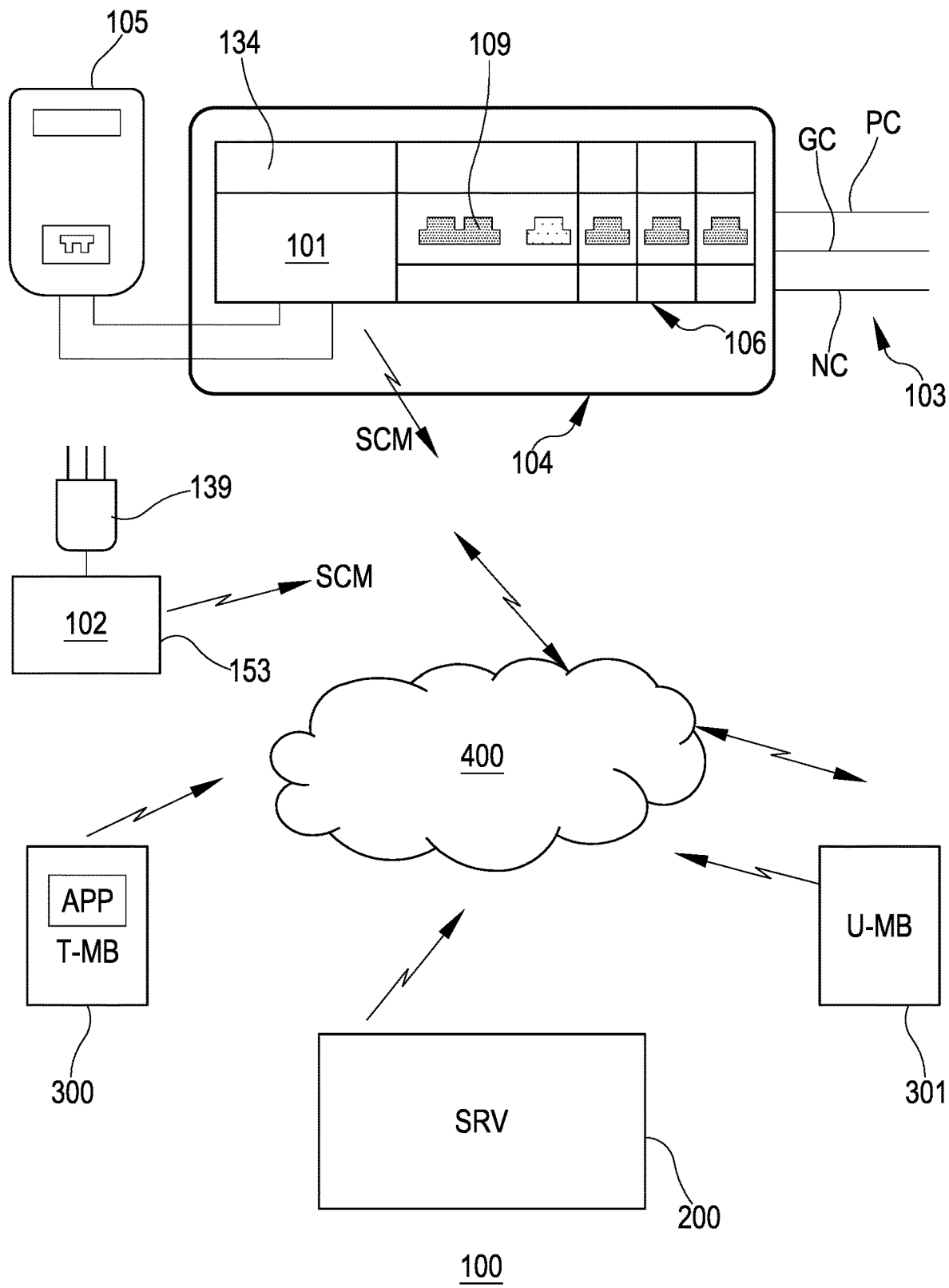
FIG. 1 schematically shows an example of an electrical installation measuring system.

The Applicant has noticed that the metering electrical installation systems currently employed by electricians require complex and time-consuming test procedures.

An electrical installation measuring system that makes the test procedures easier and faster than that performable with traditional metering devices would satisfy a need felt by the professional operators.

The Applicant has found that by employing an electrical parameter measuring device which also controls a variable load device electrically connectable to different points of the electrical installation, to assume a plurality of load configurations, allow reducing complexity and time of test procedures, in comparison with traditional techniques.

According to a first aspect, the present disclosure relates to an electrical installation measuring system comprising: a control and measuring device designed to be installed on an electrical panel (104) of an electrical installation and configured to: perform at least one measure of an electrical parameter of the electrical installation depending on an electrical load connected to the electrical installation; and transmit command signals along a telecommunication link; a variable load device connectable to the electrical installation and configured to: receive said command signals from the telecommunication link; and assume a plurality of load configurations according to said command signals.

In an embodiment, said variable load device is portable and configured to be electrically connected to the electrical installation to operate as an electrical load of the electrical installation.

In an embodiment, the variable load device comprises an electrical plug to be connected to a socket of said electrical installation.

In an embodiment, the control and measuring device comprises: a measuring circuit configured to perform said at least one measure of an electrical parameter of the electrical installation; a first wireless communication circuit configured to transmit said command signals; a control and processing device configured to manage the operation of the measuring circuit and the first wireless communication circuit.

In an embodiment, the variable load device comprises: a variable impedance circuit comprising at least one impedance and configured to assume a plurality of values according to said plurality of load configurations; a second wireless communication circuit configured to receive said command signals from the first wireless communication circuit; a control device connected to said second wireless communication circuit and configured to manage the operation of the variable impedance circuit according to the command signals.

In an embodiment said least one impedance is a variable impedance configured to assume a plurality of selectable impedance values according to adjusting signals produced by the control device and depending on said command signals.

In an embodiment, the least one impedance includes at least an electrical device selected from the group: a variable resistive load, a variable inductive load, a variable capacitive load, variable differential current generating circuit.

In an embodiment, the variable load device comprises: at least one output terminal connectable in removable manner to the electrical installation; at least one switch device configured to connect/disconnect said at least one impedance to/from said least one output terminal according to switch signals provided by said control device in accordance with said control signals.

In an embodiment, control and measuring device is configured to perform a measuring procedure by: transmitting procedure command signal to make the variable load device, when connected to the electrical installation, to assume a procedure load configuration; performing said at least one measure of an electrical parameter of the electrical installation depending on said procedure load configuration assumed by variable load device to provide at least one measured value.

In an embodiment, said control and measuring device is further configured to process said at least one measured value to produce at least one computed electrical parameter.

In an embodiment, the control and measuring device comprises: a first voltage meter to be connected between a phase conductor and a ground conductor of the electrical installation; a second voltage meter to be connected between the phase conductor and neutral conductor of the electrical installation; a first current meter to be connected between to the phase conductor; a second current meter to be connected to the neutral conductor.

In an embodiment, the system is configured to perform, according to said measuring procedure, at least one measures selected from the group: earth loop impedance; measure of a voltage drop on a portion of the electrical installation; estimation of short circuit current; test on a behaviour of a magneto-thermal switch; estimation of a differential switch trip-current; estimation of a differential switch trip-time.

In an embodiment, the system further comprises: at least computer device external to the control and measuring device and configured to exchange data with said control and measuring device and store values of electrical parameters; and at least a client device configured to exchange data/information with said control and measuring device and to access to said stored values by a user of said at least a client device.

In an embodiment, each of the control and measuring device and said variable load device comprises: a respective housing and a respective electrical power supply circuit.

In an embodiment, the system is configured to operate on an electrical installation of a typology selected from: single-phase electrical installation, three-phase electrical installation.

Figure 2:
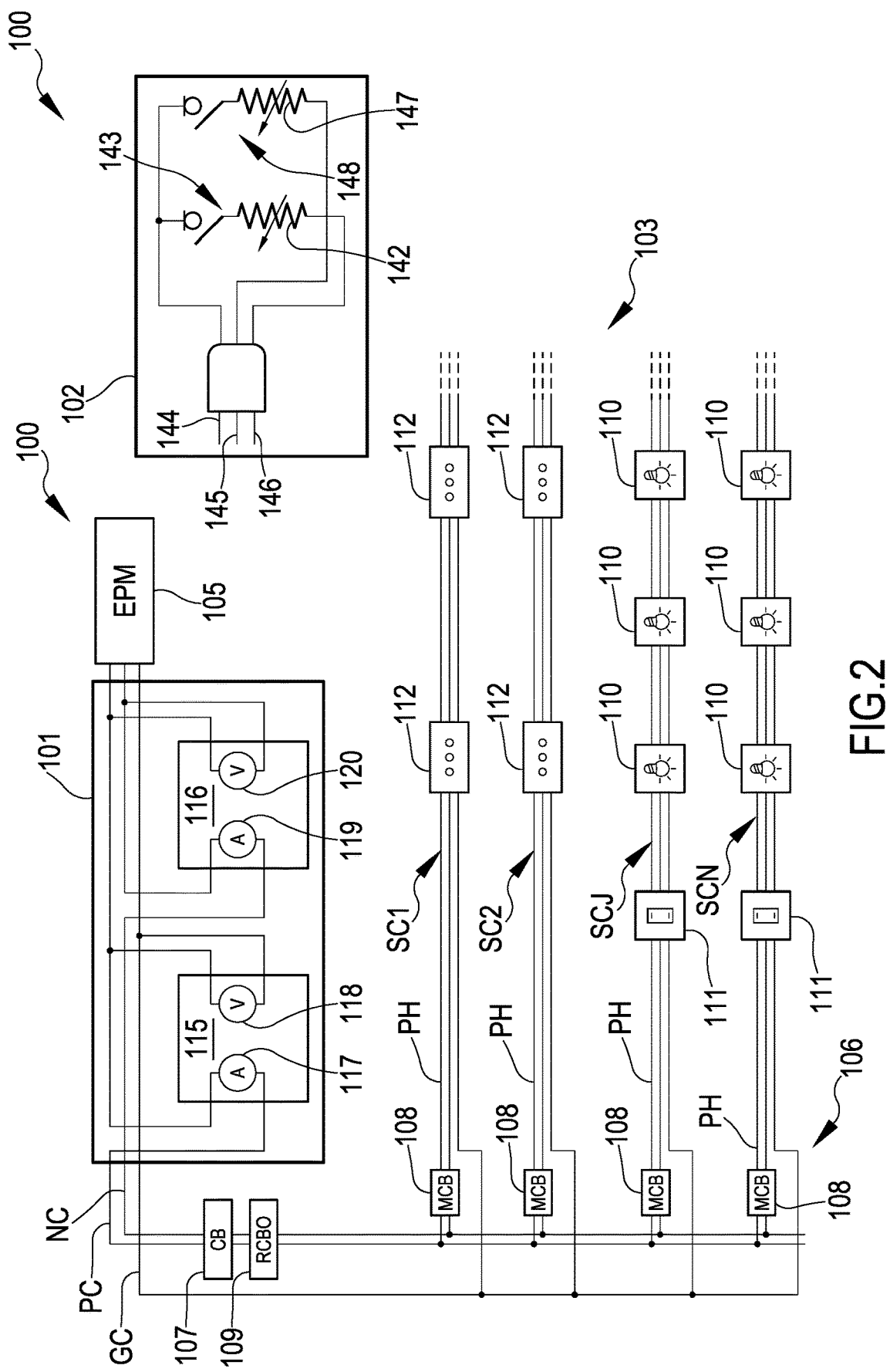
FIG. 2 exemplarily shows a control and measuring device, a variable load device of the electrical installation measuring system of FIG. 1.

FIGS. 1 and 2 illustrate an example of an electrical installation measuring system 100 comprising a control and measuring device 101 and a variable load device 102. A represented in FIG. 1, the system 100 can further include at least one computer device 200 (SRV) configured to provide functionality to the control and measuring device 101 and to at least one client device, such as an example, a technician device 300 (T-MB) and a user device 301 (U-MB).

Particularly, the computer device 200 is configured to operate as a server computer for the control and measuring device 101, the user device 301 and/or the technician device 300. According to an example, computer device 200 can be part of a cloud computing architecture. Each of the technician device 300 and the user device 301 can be, as an example, a mobile phone (for example a smartphone) a laptop, a personal computer.

The electrical installation measuring system 100 is configured to perform electrical measures of parameters of an electrical installation (also known as "electrical wiring") 103, such as, a home wiring for low voltage applications.

For example, the electrical installation 103 is a single-phase electrical system comprising a phase conductor PC, a neutral conductor NC and a ground conductor GC, connected to an earthing system (not shown). As an example, the electrical installation 103 is structured to operate at voltage included into the range 100-400 V, with a frequency comprised into the range 50-60 Hz.

According to the example of FIG. 1 and FIG. 2, the electrical installation 103 also comprises an energy provider meter 105 (EPM) connected to an electrical panel 104 comprising at least one electrical circuit protection device 106. As shown in FIG. 2, the electrical circuit protection device 106 can be a device selected from the group comprising: circuit breaker 107 (CB), miniature circuit breaker 108 (MCB), residual circuit breaker (RCB, not shown) and residual current circuit breaker with overload protection 109 (RCBO). As an example, the residual current circuit breaker with overload protection 109 includes residual circuit breaker and a magneto-thermal switch.

Moreover, the electrical installation 103 comprises junction boxes (not shown) that allows dividing the phase conductor PC, the neutral conductor NC and the ground conductor GC into a plurality of subsidiary circuits SC1-SCN. The junction boxes can be part of the electrical panel 104 and/or can be external to the electrical panel 104.

Particularly, the subsidiary circuits SC1-SCN can be connected to permanently installed electrical loads 110, such as an example, lighting devices, controlled by electrical switches 111 or to sockets 112, for the connection to portable electrical loads (such as, portable appliances, telephone, heating or ventilation system control).

The control and measuring device 101 can be configured to be installed in the electrical panel 104, for example, the control and measuring device 101 is electrically connected between the energy provider meter 105 and the electrical circuit protection devices 106 of the electrical panel 104 (FIG. 1). The control and measuring device 101 is configured to transmit commend signals SMC (FIG. 1) to the variable load device 102 and perform at least a measure of an electrical parameter of the electrical installation 103.

The variable load device 102 can be connected to the electrical installation 103. As an example, the variable load device 102 is connectable to any of the electrical sockets 112 or to other points of the electrical installation 103 by means of connection terminals different from the socket 112. The variable load device 102 and the control and measuring device 101 can communicate by a telecommunication link. Moreover, the variable load device 102 is configured to receive, via said telecommunication link, the command signals SMC transmitted by the control and measuring device 101 and assume a plurality of load configurations according to said command signals.

Figure 3:
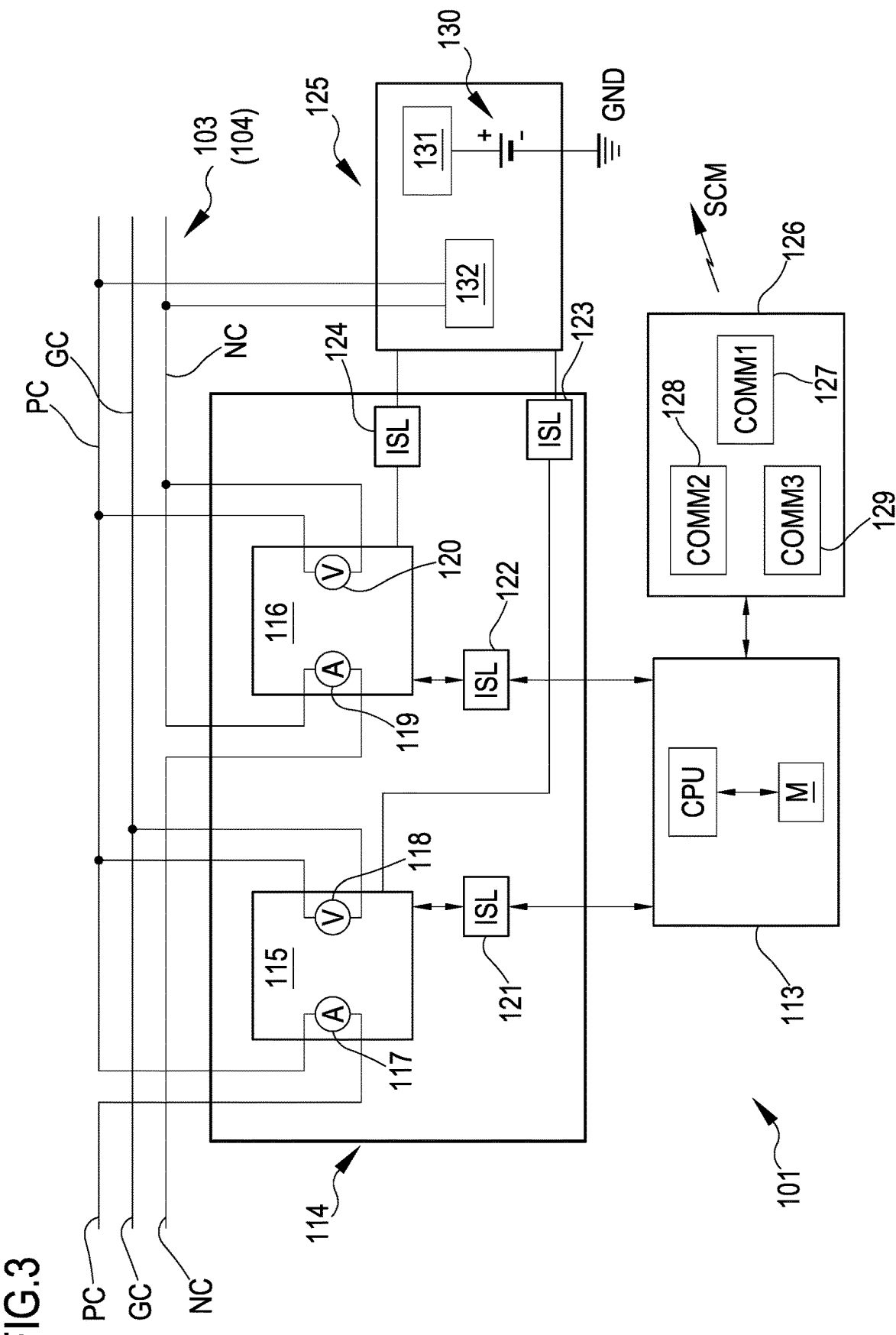
FIG. 3 shows an embodiment of the control and measuring device of FIG. 2.

FIG. 3 schematically shows an example of the electrical control and measuring device 101 comprising a control and processing device 113 (CONTR-PROC) and a measuring circuit 114.

The control and processing device 113 can be, as an example, a microprocessor or a microcontroller and comprises one or more control processing units (CPU) and memories, including at least one programmable memory M. A memory of the control and processing device 113 stores a software containing instructions configured to manage the operation of the control and measuring device 101.

According to the example, the measuring circuit 114 comprises a first measuring device 115 and a second measuring device 116. The first measuring device 115 is configured to perform measures of electrical parameters relating to the phase conductor PC and the ground conductor GC, such as an example, the phase-to-earth voltage and the phase current. In the present example, the first measuring device 115 is provided with a first current meter 117, connected to the phase conductor PC, and a first voltage meter 118 connected between the phase conductor PC and the ground conductor GC.

According to an example, the second measuring device 116 is configured to perform measures of electrical parameters relating to the phase conductor PC and the neutral conductor NC, such as an example, the phase-to-neutral voltage and the neutral current. In the present embodiment, the second measuring device 116 is provided with a second current meter 119, connected to the neutral conductor NC, and a second voltage meter 120 connected between the phase conductor PC and the neutral conductor NC.

Moreover, the measuring circuit 114 can comprise a first isolator 121 (ISL) configured to electrically isolate the first measuring device 115 from the control and processing device 113. The measuring circuit 114 can comprise a second isolator 122 (ISL) configured to electrically isolate the second measuring device 116 from the control and processing device 113. The first 121 and second 122 isolators can be, for example, known galvanic isolators or known opto-isolators.

Particularly, the control and measuring device 101 is provided with a first power supply device 125. The measuring circuit 114 can also comprise a third isolator 123 (ISL) and a fourth isolator 124 (ISL), analogous to the above described first isolator 121. The third isolator 123 is configured to electrically isolate the first measuring device 115 from a power supply device 125 and the fourth isolator 124 is configured to electrically isolate the second measuring device 116 from the first power supply device 125.

It is noticed that the first measuring device 115 and, analogously, the second measuring device 116, can be commercially available energy meters realized by an integrated circuit. As an example, the energy metering ADE9153A produced by Analog Devices Inc (USA) can be employed. In such example, the first (second) measuring device 115 (116) is provided with at least one analog-to-digital converter and a digital signal processing device configured to measure a plurality of electrical quantities. Preferably, the first and second measuring devices 115 and 116 may include a temperature sensor and a timer.

The control and measuring device 101 is provided with a first communication apparatus 126, such as a wireless communication apparatus, configured to allow communication with the variable load device 102 and, in some embodiments, additional apparatuses external to the measuring device 101. The first communication apparatus 126 is configured to operate under the control of the control and processing device 113 and exchange data with the control and processing device 113 itself.

Particularly, the first communication apparatus 126 includes a first wireless transceiver circuit 127 (COMM1) configured to communicate with the variable load device 102. As an example, the first wireless transceiver circuit 127 operates according to the LoRa (Long Range) technology. As known, LoRa is a low-power wide-area network (LP-WAN) technology based on spread spectrum modulation techniques derived from chirp spread spectrum (CSS) technology.

The first communication apparatus 126 can further include a second wireless transceiver circuit 128 (COMM2) configured to allow communication with the server computer 200 and the client device 300 (FIG. 1). As an example, the second wireless transceiver circuit 128 can operate according to a WiFi technology allowing the access to an Internet system 400 to exchange data with the server computer 200 and the client device 300.

Advantageously, the communication apparatus 126 may be provided with a third wireless transceiver circuit 129 (COMM3) configured to perform the functions of the second wireless transceiver circuit 127 in case of absence of supply electric power. As an example, the third wireless transceiver circuit 129 can be structured to operate according to the NB-IoT (Narrowband Internet of Things) technology. As known to the skilled in the art, (NB-IoT) is a Low Power Wide Area Network (LPWAN) radio technology that focuses specifically on indoor coverage, low cost, long battery life, and high connection density.

The above mentioned first power supply device 125 is configured to supply electrical power to the devices/components of the control and measuring device 1 obtained from the electrical installation 103 or from an optional rechargeable battery 130 (e.g. a lithium-ion battery). According to an example, the first power supply device 125 comprises a battery charger manager 131 and alternate current-to-direct current converter 132 configured to convert into a direct current the alternate electrical current supplied by the electrical installation 103.

The control and measuring device 101 is housed in a housing 134 that can be fixed to the electrical panel 104 allowing the above indicated electrical connections with the electrical installation 103.

Figure 4:
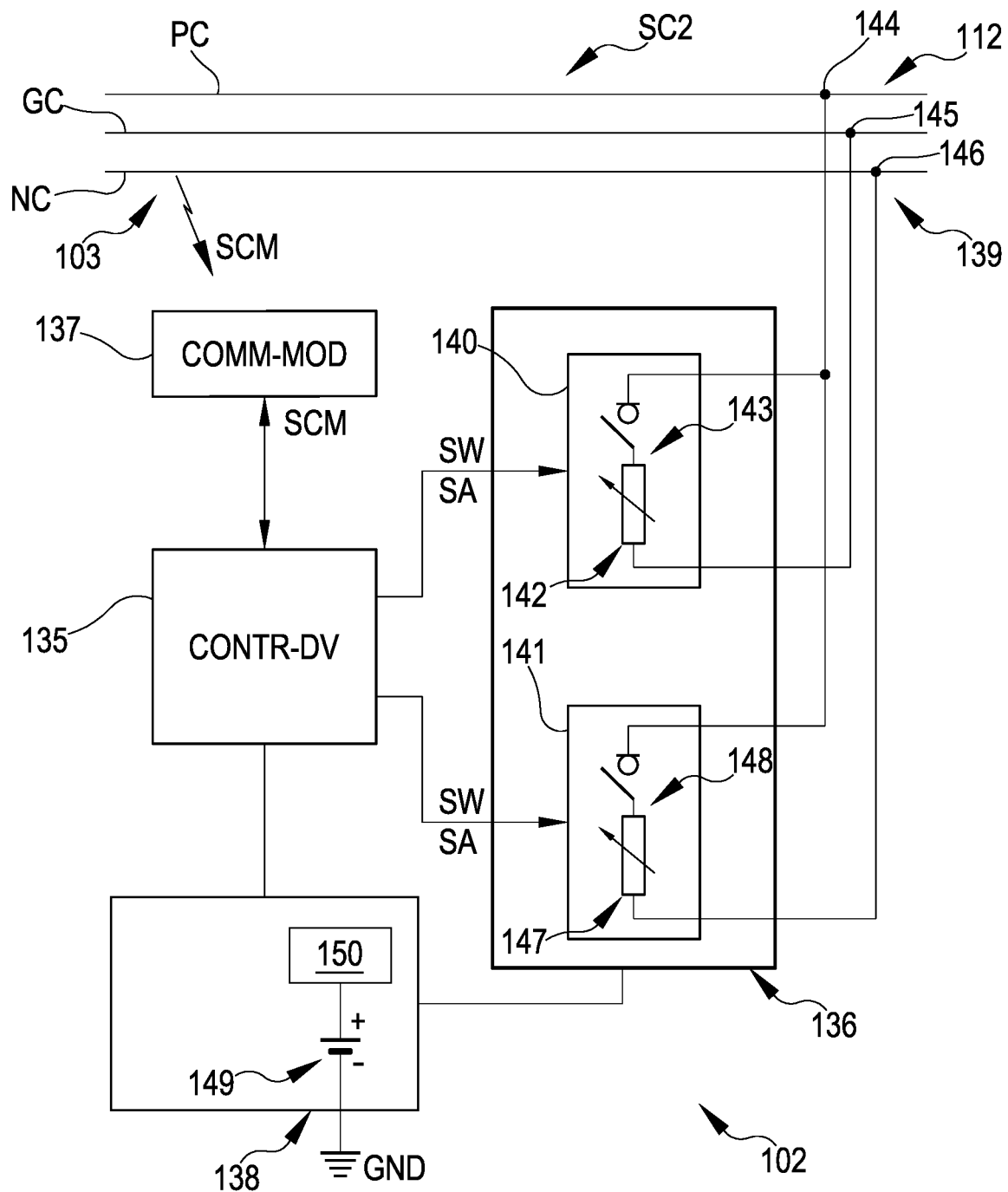
FIG. 4 shows an embodiment of the variable device of FIG. 2.

According to an example, shown in FIG. 4, the variable load device 102 comprises a control device 135 (CONTR-DV), a variable impedance circuit 136, a second communication circuit 137 and a second power supply circuit 138. Moreover, the variable load device 102 is provided with a plug 139 that can be inserted into a socket 112 of one of the subsidiary circuits SC1-SCN (e.g. a second subsidiary circuit SC2) of the electrical installation 103.

The control device 135 can be, as an example, a microprocessor or a microcontroller and comprises one or more control processing units and memories, including at least one programmable memory. The control device 135 is, as an example, analogous to the control and processing device 113 of the control and measuring device 101. The control device 135 stores a software program configured to manage the operation of the variable impedance circuit 136 according to command signals SMC received from the control and measuring device 101.

The variable impedance circuit 136 can assume a plurality of load configurations depending on control signal sent by the control and measuring device 101 and received at the second communication circuit 137. Particularly, variable impedance circuit 136 comprises at least one variable impedance that can assume a plurality of values.

The plug 139, to be inserted into the socket 112, comprises a first terminal 144, a second terminal 145 and a third terminal 146.

According to an example, the variable impedance circuit 136 comprises a first adjustable impedance device 140 and a second adjustable impedance device 141. The first adjustable impedance device 140 comprises at least one first variable impedance 142 and a first switch 143. The first variable impedance 142 comprises a terminal connected to the second terminal 145 of the plug 139 and another terminal connected the first switch 143 which is also connected to the first terminal 144 of the plug 139. The first switch 143 is configured to be closed/opened to connect/disconnect the first variable impedance 142 to/from the first terminal 144.

The second adjustable impedance device 141 comprises at least one second variable impedance 147 and a second switch 148. The second variable impedance 147 comprises a terminal connected to the third terminal 146 of the plug 139 and another terminal connected the second switch 148 which is also connected to the first terminal 144 of the plug 139. The second switch 148 is configured to ben closed/ opened to connect/disconnect the first variable impedance 142 to/from the first terminal 144.

The first switch 142 and the second switch 147 can assume a closed or an opened configuration according to switch signals SW provided by the control device 135. Each of the first switch 142 and the second switch 147 can be a semiconductor device such as an IGBT (Insulated Gate Bipolar Transistor), a TRIAC (TRIode for Alternating Current) or a thyristor.

The first variable impedance 142 and the second variable impedance 147 can assume a plurality of impedance values according to adjusting signals SA provided by the control device 135. Each of the first variable impedance 142 and the second variable impedance 147 can include a device selected from the group: a variable resistive load, a variable inductive load, a variable capacitive load or a combination thereof.

As an example, when the plug 139 is inserted into a socket 112, the first adjustable impedance device 140 is electrically connected between the phase conductor PC and the ground conductor GC, and the second adjustable impedance device 141 is electrically connected between the phase conductor PC and the neutral conductor NC.

The second communication circuit 137 includes a wireless transceiver circuit configured to communicate with the first wireless transceiver circuit 127 of the control and measuring device 101. According to the described example, the second communication circuit 137 operates according to the LoRa (Long Range) technology.

The second power supply circuit 138 is configured to supply electrical power to the components/circuits of the variable load device 102 provided by the electrical installation 103 or by a further rechargeable battery 149. The second power supply circuit 138 can include a further battery charger manager 150.

It is further noticed that the variable load device 102 is housed in a further housing 153 and can be a portable device.

The electrical installation measuring system 100 (hereinafter, referred as "measuring system") is configured to perform electrical measures of electrical parameters of the electrical installation 103. Particularly, the measuring system 100 is configured to support electricians in performing the required checks during the test of a new electrical installation or during its maintenance or periodic controls.

According to a possible implementation, the control and measuring device 101 is steady mounted to the electrical panel 104 while the variable load device 102 is portable and managed by the electrician. For example, the variable load device 102 can be electrically connected to different sockets 112 of the electrical installation 103 or to specific points of the electrical installation 103 by means of other type of connection terminals, depending on the specific test to be made. According to an example, the variable load device 102 can be connected to replace one of the electrical loads no.

As an example, the technician who performs tests on the electrical installation 103 employs the technician mobile phone 300, provided with a corresponding mobile application (APP), to communicate with the control and measuring device 101 and with the server computer 200. The technician can communicate with the control and measuring device 101 to perform specific test procedures which can be selectable from the mobile application APP. The communication between the control and measuring device 101 and the technician mobile phone 300 is allowed, according to an example, by the second wireless transceiver circuit 128 (FIG. 2). It is also observed that the control and measuring device 101 can store the measured electrical parameters in the server computer 200 and make them available for monitoring purpose.

With reference to the measures of electrical parameters, the control and measuring device 101 and the variable load device 102 operate as "master device" and "slave device", respectively. Particularly, measuring system 100 allows performing measuring procedures that include a collaboration between the control and measuring device 101 ("master") and the variable load device 102 (slave).

It is further underlined that, notwithstanding the following description of specific electrical parameter measures is made considering the case of a connection of the variable load device 102 to a socket 112, an analogous description is valid for a connection of the variable load device 102 made in connection points of the electrical installation 103 different from the sockets 112.

An example of measuring procedures is described below with reference to the measure of a voltage drop ΔV on a portion (having an unknown electrical resistance Rcc) of the electrical installation 103 comprised between the control and measuring device 101 and the socket 112 where the variable load device 102 has been connected. This example is also described with reference to FIG. 5.

The technician informs the control and measuring device 101 of the requested measure by using the technician mobile phone 300, which communicates, as an example, with the second wireless transceiver circuit 128 (FIG. 3) of the control and measuring device 101. The control and processing device 113, connected to the second wireless transceiver circuit 128, transmits a corresponding command signal SCM that is received at the second communication circuit 137, included into the variable load device 102 (FIG. 4). The control device 135 of the variable load device 102 analyses the command signal SCM to determine, as an example, a software portion associated with the specific electrical measure. In accordance with said software portion, the control device 135 generates an adjusting signal SA fixing a resistance value Rn for the second variable impedance 147. The value of the resistance Rn is also available by the control and measuring device 101.

Moreover, the control device 135 generates a switch signal SW causing the closing of the second switch 148; the second variable impedance 147, having resistance Rn, is therefore connected between the phase conductor PC and the neutral conductor NC. According to this example, the first variable impedance 142 is not connected to the electrical installation 103 since it is not involved in the specific measuring procedure.

In the above mentioned load configuration, the control and measuring device 101 performs the measure of the electrical current $I_F$ flowing in the phase conductor PC and the measure on the voltage $V_{FN}$ between the phase conductor PC and the neutral conductor NC. Particularly, the control and processing device 113 enables the first current meter 117 of the first measuring device 115 to measure the electrical current $I_F$. Moreover, the control and processing device 113 enables the second voltage meter 120 of the second measuring device 116 to measure the voltage $V_{FN}$.

Then, the control and processing device 113 acquires the measured values $I_F$ and $V_{FN}$ and computes the voltage drop ΔV according to the equation:

$$\Delta V = V_{FN} - I_F \cdot R_n$$

The computed voltage drop ΔV, which can be stored into the memory M of the control and processing device 113, can be transmitted to the server computer 200 from which it can be read by the technician mobile phone 300.

At the end of the measure, the control and measuring device 101 transmits towards the variable load device 102 another command signal SCM in order to cause the opening of the second switch 148 and the disconnection of the second variable impedance 147 from the plug 139 and the electrical installation 103.

It is noticed that there are further possible measures of electrical parameters that can be performed by the control and measuring device 101 basing on corresponding load configurations assumed by the variable load device 102. Examples of such further measures are described herein below.

Figure 5:
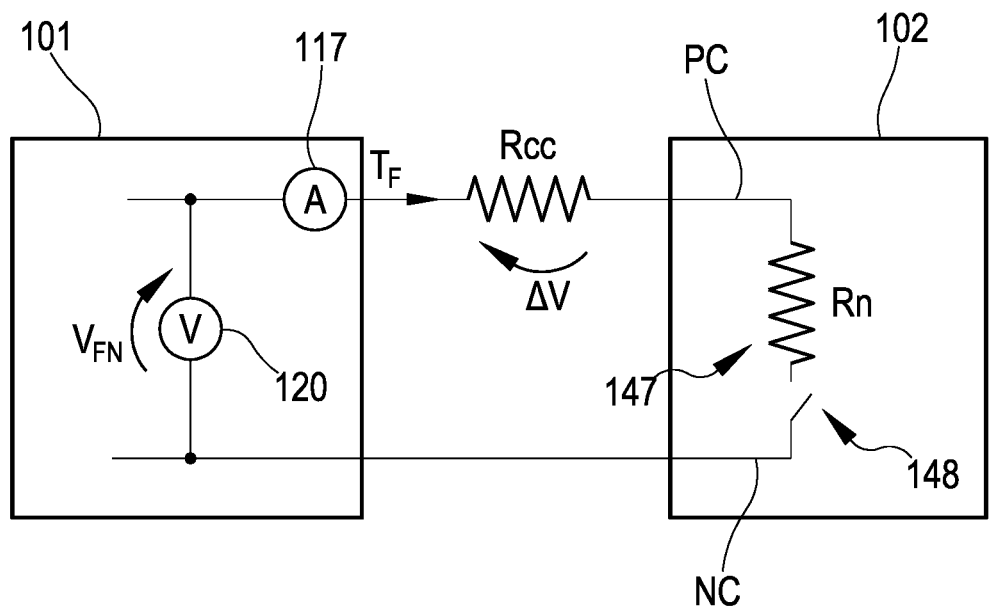
FIG. 5 illustrates a working configuration assumed by the electrical installation measuring system to perform the measure of an electrical parameter.

According to a first example, the control and measuring device 101 can estimate the short-circuit current employing the load configuration above described with reference to FIG. 5. Particularly, the short-circuit resistance Rcc is computed by the equation:

$$R_{cc} = \frac{\Delta V}{I_F}$$

The estimated short-circuit current MaxIcc is computed as:

$$\text{Max}I_{cc} = \frac{V_{FN}}{R_{cc}}$$

According to a second example, the electrical installation measuring system 100 can be employed to perform a test on a magneto-thermal switch, such as an example, a switch included into the miniature circuit breaker 108 protecting one of the subsidiary circuit SC1-SCN. The estimated short-circuit current MaxIcc is compared with the maximum trip-current $I_{TR}$ of the magneto-thermal switch 108. If the maximum trip-current $I_{TR}$ is greater than the estimated short-circuit current MaxIcc the test can be performed: a short-circuit condition is simulated to test the behavior of the magneto-thermal switch 108.

According to said test, the control and measuring device 101 sends a command signal SCM to the variable load device 102 so as that the first variable impedance 142 assumes a specific resistance value and is connected between the phase conductor PC and the ground conductor GC.

The control and measuring device 101 monitors, by means of the first current meter 117, if the current flowing into the phase conductor PC is interrupted because of the opening of the magneto-thermal switch 108. If the magneto-thermal switch 108 does not interrupt the current, the test is automatically stopped after a pre-established time interval monitored by the timer device included into the control and measuring device 101.

In accordance with a second example, the electrical installation measuring system 100 is employed to evaluate the differential switch trip-current $I_{dn}$ associated, as an example, with the residual current circuit breaker 109. According to this example, the first adjustable impedance device 140 can be driven to operate as a variable differential current generating circuit to produce a variable differential current ranging, as an example, from 0 to 50 mA, with 0.5 mA steps or with a continuous increasing. The first adjustable impedance device 140 is connected between the phase conductor PC and the ground conductor GC and is controlled to generate the differential current with an increasing of a pre-established quantity (e.g. 0.5 mA) every time interval T (e.g. T=50 ms). The value $I_{dn}$ assumed by the differential current at the switching of the residual current circuit breaker 109, representing the differential switch trip-current, is measured by the control and measuring device 101.

The generation of variable differential current can be obtained, as an example, by an IGBT interrupter connected to a resistor driven by a PWM (Pulse Wave Modulation) signal produced by the control device 135 of the variable load device 102.

In accordance with a third example, the electrical installation measuring system 100 is employed to evaluate the differential switch trip-time of a residual current circuit breaker (such as the miniature breaker 108 or the RCBO 109), also referred as differential switch. Considering the value $I_{dn}$ differential switch trip-current evaluated, as above indicated, the variable differential current generating circuit of the variable load device 102 is controlled to produce a differential current of $I_{dn}$, $2I_{dn}$, and finally of $5I_{dn}$.

In the three cases, the time interval between an initial time instant $t_0$ in which the current $I_{dn}$, $2I_{dn}$ or $5I_{dn}$ is applied and a switching time $t_1$, in which the switch tripping occurs, is evaluated through a timer (e.g. a high-resolution timer) included into the control and measuring device 101. Preferably, if the differential switch 109 does not break in a maximum time interval (e.g. 100ms) the test is automatically interrupted by the control and measuring device 101 to avoid overheating. It is observed that, advantageously, the exact time of circuit breaking can be evaluated by the control and measuring device 101.

It is further noticed that the first measuring device 115 and the second measuring device 116 (included into the measuring circuit 114 of the control and measuring device 101) can also perform measures of electrical parameters independently from the variable load device 102, i.e. without a collaboration with the variable load device 102.

Particularly, measuring circuit 114 is configured to perform measures of at least one electrical parameter selected from the group:

$v_{FT}$: Phase-to-earth Voltage, i.e. the voltage between the phase conductor PC and the ground conductor GC;

$v_{FN}$: Phase-to-neutral Voltage, i.e. the voltage between the phase conductor PC and the neutral conductor GNC;

$i_F$: Phase Current; i.e. the current flowing into the phase conductor PC;

$i_N$: Neutral Current, i.e. the current flowing into the neutral conductor NC.

Preferably, for the Phase-to-earth Voltage $v_{FT}$, the Phase-to-neutral Voltage $v_{FN}$, the Phase Current $i_F$ and the Neutral Current $i_N$ can be measured the corresponding waveforms and the corresponding Root Mean Square (RMS) values: $V_{FT}$, $V_{FN}$, $I_F$, $I_N$.

Moreover, measuring circuit 114 can also perform measures of at least one electrical parameter selected from the group:

f: Frequency
φ: Current to Voltage Phase shift
$PF_{I_N}$: Power factor, $I_F/v_{FN}$
$PF_{I_F}$: Power factor, $I_N/v_{FN}$
T: Temperature In addition, as an example, the first measuring device 115 and the second measuring device 116 are configured to compute at least one additional parameter selected from the group: Active Power p, Reactive Power q, Active Energy, Reactive Energy. Particularly, the corresponding waveforms and RMS values are computed for the above listed electrical parameters.

The control and measuring device 101 can also perform, by means of the control and processing device 113, computing of further parameters such as: differential current and/or earth loop impedance.

As an example, the differential current $I_{\Delta n}$ is computed by the control and processing device 113, considering the measured parameters Phase Current IF and Neutral Current IN with a power factor correction based on Power factor $PF_{I_N}$ and Power factor $PF_{I_F}$, according to the equation:

$$I_{\Delta n} = \sqrt{\left(I_F \cdot PF_{I_F} - I_N \cdot PF_{I_N}\right)^2 + \left(I_F \cdot \left(1 - PF_{I_F}^2\right) - I_N \cdot \left(1 - PF_{I_N}^2\right)\right)^2}$$

According to an example, the earth loop impedance Re is evaluated by the control and measuring device 101 (independently from the variable load device 102) as a difference between the Phase-to-Neutral Voltage VFN, and the Phase-to-earth Voltage VFT, divided by differential current $I_{\Delta n}$:

$$Re = \frac{V_{FN} - V_{FT}}{I_{\Delta n}}$$

Figure 6:
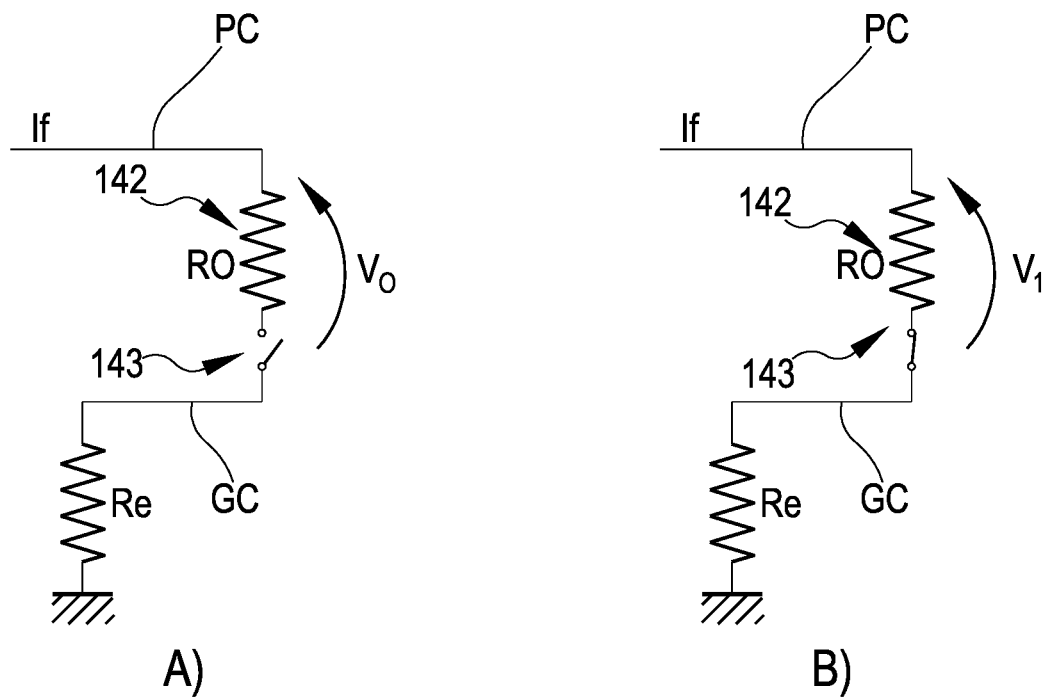
FIG. 6 refers to further working configuration assumed by the electrical installation measuring system perform the measure of another electrical parameter.

It is observed that the earth loop impedance Re can be also evaluated by a cooperation of the control and measuring device 101 and the variable load device 102. As schematized in FIG. 6, when the first switch 143 is opened a voltage Vo between the phase conductor PC and the ground conductor GC is measured by the first voltage meter 118. By closing the first switch 143 a first variable impedance 142 having a negligible resistance Ro is introduced by the variable load device 102 between the phase conductor PC and the ground conductor GC: a corresponding voltage $V_1$ is measured by the first voltage meter 118 and the phase current IF is measured by the first current meter 117. The earth loop impedance Re can be obtained from the equation:

$$Re = \frac{V_0 - V_1}{I_f}$$

According to a particular embodiment, the control and measuring device 101 is also configured to detect particular events occurring in the electrical installation 103. Particularly, at least one of the following detections can be performed: AC detection, Overcurrent detection, Overvoltage detection, Undervoltage detection, abnormal frequency detection.

The AC detection is triggered when the phase-to-neutral voltage is zero. The Overcurrent detection is triggered when the phase current reaches a threshold current value. The Overvoltage detection is triggered when the phase-to-neutral voltage reaches a maximum threshold voltage value. The Undervoltage detection is triggered when the phase-to-neutral voltage reaches a minimum threshold voltage value.

The control and measuring device 101 can be also configured to automatically perform a monitoring (both historical and real time) of main parameters of the electrical installation 103, such as: load and ground voltage (to verify the nominal values), load and differential current (to verify potential faults), active and reactive power, ground connection.

It is noticed that the control and measuring device 101 can be configured to send to the user device 301, as an example, via the server computer device 200, notices of specific detected events. According to an embodiment, the user can be notified in case of: abnormal system behaviour (unsafe device connected, fault in earth-loop connection, mismatching of electrical input parameter or high temperature in electrical cabinet, etc); no power supply; signal loss, system maintenance required.

It is also observed that even if the above description referred to a single-phase electrical installation 103, the electrical installation measuring system 100 can be also employed for measuring electrical parameters in three-phase electrical installations. The skilled person recognizes as the measures exemplary described with reference to the single-phase conductor PC can be also performed for the other two phase conductors of a three-phase electrical installation. In this case, the number of measuring devices, analogous to the first measuring device 115, included in the control and measuring device 101 may be chosen in order to allow measuring electrical parameters relating to the others two phase conductors of the three-phase electrical installation.

The described electrical installation measuring system 100 provides advantages for the professional technicians. Particularly, the electrical installation measuring system 100 allows performing the needed measures and tests in a manner easier and faster that that obtainable with traditional apparatuses. The electrical installation measuring system 100 can be manufactured with non-expensive components.

Moreover, the described electrical installation measuring system 100 can also provide advantages for the final users (i.e. household landlord). Particularly, the automatic monitoring of the electrical installation allows actively increasing its safety, providing information about potential fault conditions and keeping electricity consumption under control.

What is claimed is:

1. An electrical installation measuring system comprising:
   a control and measuring device configured to be installed on and electrically connected to an electrical panel of an electrical installation and configured to:
      perform at least one measure of an electrical parameter of the electrical installation depending on an electrical load connected to the electrical installation; and
      transmit command signals along a telecommunication link; and
   a variable load device connectable to the electrical installation and configured to:
      receive said command signals from the telecommunication link; and
      assume a plurality of load configurations according to said command signals.

2. The measuring system of claim 1, wherein the variable load device is portable and configured to be electrically connected to the electrical installation to operate as an electrical load of the electrical installation.

3. The measuring system of claim 2, wherein the variable load device comprises an electrical plug to be connected to a socket of the electrical installation.

4. The measuring system of claim 1, wherein the control and measuring device is configured to perform a measuring procedure by:
   transmitting procedure command signals to make the variable load device, when connected to the electrical installation, to assume a procedure load configuration; and
   performing the at least one measure of an electrical parameter of the electrical installation depending on the procedure load configuration assumed by variable load device to provide at least one measured value.

5. The measuring system of claim 4, wherein the control and measuring device is further configured to process the at least one measured value to produce at least one computed electrical parameter.

6. The measuring system of claim 4, wherein the system is configured to perform, according to the measuring procedure, at least one selected from the group: measure a earth loop impedance; measure a voltage drop on a portion of the electrical installation; estimate a short circuit current; test on a behavior of a magneto-thermal switch; estimate a differential switch trip-current; and estimate a differential switch trip-time.

7. The measuring system of claim 1, wherein the control and measuring device comprises:
   a first voltage meter to be connected between a phase conductor and a ground conductor of the electrical installation;
   a second voltage meter to be connected between the phase conductor and a neutral conductor of the electrical installation;
   a first current meter to be connected to the phase conductor; and
   a second current meter to be connected to the neutral conductor.

8. An electrical installation measuring system comprising:
   a control and measuring device configured to be installed on and electrically connected to an electrical panel of an electrical installation, wherein the control and measuring device comprises:
      a measuring circuit configured to perform a measurement of an electrical parameter of the electrical installation depending on an electrical load connected to the electrical installation;
      a first wireless communication circuit configured to transmit command signals along a telecommunication link; and
      a control and processing device configured to manage the operation of the measuring circuit and the first wireless communication circuit; and
   a variable load device connectable to the electrical installation and configured to:
      receive said command signals from the telecommunication link; and
      assume a plurality of load configurations according to said command signals.

9. The measuring system of claim 8, wherein the control and measuring device comprises:
   a first voltage meter to be connected between a phase conductor and a ground conductor of the electrical installation;
   a second voltage meter to be connected between the phase conductor and a neutral conductor of the electrical installation;
   a first current meter to be connected to the phase conductor; and
   a second current meter to be connected to the neutral conductor.

10. The measuring system of claim 8, wherein the variable load device comprises:
   a variable impedance circuit comprising an impedance and configured to assume a plurality of values according to the plurality of load configurations;
   a second wireless communication circuit configured to receive the command signals from the first wireless communication circuit; and a control device connected to the second wireless communication circuit and configured to manage the operation of the variable impedance circuit according to the command signals.

11. The measuring system of claim 10, wherein each of the control and measuring device and the variable load device comprises: a respective housing and a respective electrical power supply circuit.

12. The measuring system of claim 10, wherein the impedance is a variable impedance configured to assume a plurality of selectable impedance values according to adjusting signals produced by the control device and depending on the command signals.

13. The measuring system of claim 12, wherein the impedance includes at least an electrical device selected from the group: a variable resistive load, a variable inductive load, a variable capacitive load, a variable differential current generating circuit.

14. The measuring system of claim 10, wherein the variable load device comprises:
   an output terminal connectable in removable manner to the electrical installation; and
   a switch device configured to connect/disconnect the impedance to/from the output terminal according to switch signals provided by the control device in accordance with the command signals.

15. An electrical installation measuring system comprising:
   a control and measuring device configured to be installed on and electrically connected to an electrical panel of an electrical installation and configured to:
      perform a measurement of an electrical parameter of the electrical installation depending on an electrical load connected to the electrical installation; and
      transmit command signals along a telecommunication link;
   a variable load device connectable to the electrical installation and configured to:
      receive said command signals from the telecommunication link; and
      assume a plurality of load configurations according to said command signals;
   a computer device external to the control and measuring device and configured to exchange data with the control and measuring device and store values of electrical parameters; and
   a client device configured to exchange data/information with the control and measuring device and to access to the stored values by a user of the at least a client device.

16. The measuring system of claim 15, wherein each of the control and measuring device and the variable load device comprises: a respective housing and a respective electrical power supply circuit.

17. The measuring system of claim 15, wherein the system is configured to operate on an electrical installation of a topology selected from single-phase electrical installation, and three-phase electrical installation.

18. The measuring system of claim 15, wherein the control and measuring device comprises:
   a first voltage meter to be connected between a phase conductor and a ground conductor of the electrical installation;
   a second voltage meter to be connected between the phase conductor and a neutral conductor of the electrical installation;
   a first current meter to be connected to the phase conductor; and
   a second current meter to be connected to the neutral conductor.

19. The measuring system of claim 15, wherein the control and measuring device comprises:
   a measuring circuit configured to perform the measurement of the electrical parameter of the electrical installation depending on the electrical load connected to the electrical installation;
   a first wireless communication circuit configured to transmit the command signals along the telecommunication link.

20. The measuring system of claim 19, wherein the variable load device comprises:
   a variable impedance circuit comprising an impedance and configured to assume a plurality of values according to the plurality of load configurations;
   a second wireless communication circuit configured to receive the command signals from the first wireless communication circuit; and
   a control device connected to the second wireless communication circuit and configured to manage the operation of the variable impedance circuit according to the command signals.

* * * * *